(12) United States Patent
Kubota

(10) Patent No.: US 7,808,690 B2
(45) Date of Patent: Oct. 5, 2010

(54) ELECTRO OPTICAL DEVICE AND ELECTRONIC APPARATUS

(75) Inventor: Takehiko Kubota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 85 days.

(21) Appl. No.: 12/350,676

(22) Filed: Jan. 8, 2009

(65) Prior Publication Data

US 2009/0174924 A1 Jul. 9, 2009

(30) Foreign Application Priority Data

Jan. 9, 2008 (JP) .............................. 2008-002304
Nov. 5, 2008 (JP) .............................. 2008-284704

(51) Int. Cl.
G02F 1/03 (2006.01)
(52) U.S. Cl. ...................... 359/245; 359/259
(58) Field of Classification Search ................. 359/259, 359/245
See application file for complete search history.

(56) References Cited

U.S. PATENT DOCUMENTS

2003/0116719 A1* 6/2003 Miyazawa ............... 250/484.2

FOREIGN PATENT DOCUMENTS

JP A-08-114817 5/1996
JP A-2005-251721 9/2005

* cited by examiner

Primary Examiner—Jordan M. Schwartz
Assistant Examiner—James C Jones
(74) Attorney, Agent, or Firm—Oliff & Berridge, PLC

(57) ABSTRACT

An electro optical device having a substrate, scanning lines, data lines, and pixel electrodes arranged to correspond to intersections of scanning and data lines, a counter electrode opposite the substrate from a pixel electrode, an emission layer between the pixel electrode and the counter electrode, a driving transistor connected to the pixel electrode, a driving circuit for supplying a signal to at least one of the scanning lines and data lines, a potential supply line for the driving circuit, an insulating film between the driving transistor and the counter electrode, the insulating film in a first area on the substrate, and a planarizing layer covering the counter electrode, wherein the potential supply line extends along an edge of the substrate in a second area, and the planarizing layer covers the insulating film and overlaps with at least a part of the potential supply line in the second area.

17 Claims, 9 Drawing Sheets

ELECTRO OPTICAL DEVICE AND ELECTRONIC APPARATUS

CROSS REFERENCE TO RELATED APPLICATIONS

This application claims priority to Japanese Application No. 2008-002304 filed in Japan on Jan. 9, 2008 and to Japanese Application No. 2008-284704 filed in Japan on Nov. 5, 2008, the entire disclosures of which are hereby incorporated by reference in their entirety.

BACKGROUND

1. Technical Field

The present invention relates to an electro optical device and an electronic apparatus using an electro optical element.

2. Related Art

In recent years, various electro optical devices using an electro optical element such as an organic light emitting diode (hereinafter, referred to as "OLED") called as an organic EL (Electro Luminescent) element, a light emitting polymer element, or the like have been proposed. In such an electro optical device, in order to prevent intrusion of moisture or the like in the electro optical element provided on a substrate, it has been know to seal the electro optical device with multi-layer thin films. For example, in JP-A-2005-251721, a structure is disclosed in which a function element on a substrate is sealed by laminating a planarizing layer for planarizing the function element such as an electro optical element, a thin film transistor, or the like provided on the substrate, a buffer layer, and a barrier layer.

A potential supply line for supplying a potential to a driving circuit for driving the electro optical element is provided on the substrate. For example, as also disclosed in JP-A-8-114817, the potential supply line is disposed so as to cross the driving circuit. That is a plurality of thin film transistors constituting the driving circuit are disposed to step over the potential supply line extending on the substrate. Accordingly, when the aforementioned thin films are provided for sealing, the potential supply line on the substrate is also covered with a planarizing layer. Then, the planarizing layer is covered with a buffer layer, and the buffer layer is also provided on the side surface of the planarizing layer. A seal material is provided outside the area covered with the buffer layer on the substrate, and the substrate on which the function element is disposed is bonded to a second substrate for sealing so as to oppose to each other via the seal material.

It is preferable to narrow a frame portion except the area in which the electro optical element is disposed on the substrate of the electro optical device as far as possible. However, when the aforementioned thin film sealing is performed, not only the function element on the substrate, but also the potential supply line is covered with a planarizing layer. Accordingly, the frame portion becomes larger in accordance with the width of the potential supply line. Accordingly, there is a problem in that it is difficult to narrow the frame portion.

SUMMARY

An advantage of some aspects of the invention is to narrow a frame of an electro optical device in which thin film sealing is performed.

According to an aspect of the invention, there is provided an electro optical device comprising a substrate, a plurality of scanning lines, a plurality of data lines, a plurality of pixel electrodes arranged so as to correspond to intersections of the plurality of scanning lines and the plurality of data lines, a counter electrode (for example, counter electrode 230 shown in FIG. 2) disposed opposite the substrate when viewed from a pixel electrode (for example, pixel electrode 210 shown in FIG. 2) of the plurality of pixel electrodes, an emission layer (for example, emission layer 220 shown in FIG. 2) disposed between the pixel electrode and the counter electrode, a driving transistor electrically connected to the pixel electrode, a driving circuit (for example, scanning line driving circuit 40, data line driving circuit 50 shown in FIG. 1) for supplying a signal to at least one of the plurality of scanning lines and the plurality of data lines, a potential supply line for supplying a potential to the driving circuit, an insulating film (for example, first planarizing layer F1 shown in FIG. 2, first planarizing layer F1 and second insulating layer Fa2 shown in FIG. 8) provided between the driving transistor and the counter electrode, the insulating film being provided in a first area on the substrate, and a planarizing layer (for example, second planarizing layer F2 shown in FIG. 2) covering the counter electrode, wherein the potential supply line extends along an edge of the substrate in a second area (for example, area Y shown in FIGS. 2, 3) outside the first area (for example, area Z shown in FIGS. 1 to 3) on the substrate, and the planarizing layer covers the insulating film and overlaps with at least a part of the potential supply line in the second area.

According to the aspect, the potential supply line extends along the edge of the substrate in the second area outside the first substrate in which the insulating film is provided on the substrate, and at least a part thereof overlaps with the planarizing layer. Accordingly, the frame portion can be reduced.

Further, according to another aspect of the invention, there is provided an electro optical device in which a plurality of electro optical elements, a driving circuit that are constituted by a plurality of thin film transistors and for driving the plurality of electro optical elements, a potential supply line (for example, high potential side potential supply line VHa or low potential side potential supply line VSa shown in FIGS. 1 to 3) for supplying a potential to the driving circuit are equipped on a substrate. The electro optical device includes a first planarizing layer (for example, first planarizing layer F1 shown in FIGS. 2 and 3) covering the plurality of thin film transistors (for example, transistor Tr shown in FIGS. 2, 3), a second planarizing layer (for example, second planarizing layer F2 shown in FIGS. 2, 3) covering the first planarizing layer. The potential supply line extends along an edge (for example, edge 12 shown in FIGS. 1 to 3) of the substrate in a second area (for example, area Y shown in FIGS. 2 and 3) outside a first area (for example, area Z shown in FIGS. 1 to 3) in which the first planarizing layer is provided, and the second planarizing layer covers a side surface (for example, side surface S1 shown in FIGS. 2 and 3) of the first planarizing layer and overlaps with at least a part of the potential supply line in the second area.

According to the aspect, the potential supply line is formed in the second area outside the first area in which the first planarizing layer is provided, and the portion of the second planarizing layer in the second area overlaps with at least a part of the potential supply line in the second area. Accordingly, the frame portion can be narrowed.

It is preferable that a gas barrier layer for covering the planarizing layer is further provided, and an inclination angle of a side surface (for example, side surface S2 shown in FIGS. 2, 3) of the planarizing layer with respect to the substrate is smaller than an inclination angle of a side surface of the insulating film with respect to the substrate in the electro optical device according to the aspects of the invention. The side surface of the planarizing layer becomes flat as the inclination angle of the side surface of the planarizing layer with respect to the substrate becomes smaller than the inclination angle of the side surface of the insulating layer with respect to the substrate. Accordingly, occurrence of cracking and peeling of the gas barrier layer covering the planarizing layer can be restrained. On the other hand, dimensions of the area in which the planarizing layer is provided outside the first area becomes larger. This makes it difficult to narrow the frame portion in the aspect in which the potential supply line is covered with the insulating film. According to the aspect of the invention, at least a part of the potential supply line overlaps with the planarizing layer. Accordingly, dimensions of the frame portion can be reduced as compared with the aspect in which the potential supply line is covered with the insulating film. That is, according to the aspect of the invention, the frame portion can be narrowed while restraining occurrence of cracking and peeling of the gas barrier layer.

According to another aspect of the invention, there is provided an electro optical device in which a plurality of scanning lines, a plurality of data lines, a plurality of pixels arranged so as to correspond to intersections of the plurality of scanning lines and the plurality of data liens, a driving circuit for supplying a signal to at least one of the plurality of scanning lines or the plurality of data lines, and a potential supply line for supplying a potential to the driving circuit are provided on a substrate, and in which each of the plurality of pixels is equipped with a pixel electrode, a counter electrode disposed at the side opposite to the substrate when viewed from the pixel electrode, an emission layer interposed between the pixel electrode and the counter electrode, and a driving transistor electrically connected to the pixel electrode. The electro optical device includes an insulating film provided between the driving transistor and the counter electrode, a seal material disposed in a second area outside a first area among an area on the substrate, the insulating film being provided in the first area, and a second substrate bonded to the substrate via the seal material. The potential supply line extends along an edge of the substrate in the second area, and at least a part of the potential supply line overlaps with the seal material. According to the aspect, at least a part of the potential supply line overlaps with the seal material in the second area outside the first area in which the insulating film is provided, so that the frame portion can be narrowed.

According to another aspect of the invention, there is provided an electro optical device in which a plurality of electro optical elements, a driving circuit that are constituted by a plurality of thin film transistors and for driving the plurality of electro optical elements, a potential supply line for supplying a potential to the driving circuit are equipped on a substrate. The electro optical device includes a first planarizing layer covering the plurality of thin film transistors, a seal material disposed in a second area outside a first area in which the first planarizing layer is provided, and a second substrate (for example, second substrate 30 shown in FIGS. 1, 2) bonded to the substrate via the seal material. The potential supply line extends along an edge of the substrate in the second area and at least a part thereof overlaps with the seal material. According to the aspect, at least a part of the potential supply line overlaps with the seal material in the second area outside the first area in which the first planarizing layer is provided. Accordingly, the frame portion can be narrowed.

It is preferable that the counter electrode continues over the plurality of pixels and extends in the second area, and overlaps with at least a part of the potential supply line via an insulating layer covering the potential supply line in the electro optical device according to the aspects of the invention. Herewith, voltage fluctuation of the potential supply line and the counter electrode is restrained (planarized) by a capacitor (for example, capacitor Co shown in FIG. 5) formed between the counter electrode and the potential supply line.

It is preferable that the pixel electrode is disposed opposite to the substrate when viewed from the driving transistor, and the insulating film (for example first planarizing layer F1 shown in FIG. 2) is provided between the pixel electrode and the counter electrode, and separates each of the pixel electrodes in the electro optical device according to the aspects of the invention. Further, it is preferable that the insulating film (for example, second insulating layer Fa2 shown in FIG. 8) is provided between the driving transistor and the pixel electrode.

The electro optical device according to the aspects of the invention is used for various electronic apparatuses. A typical example of the electronic apparatus is an apparatus in which the electro optical device is used as a display device. As such a type of apparatus, there are included a personal computer, a mobile phone, and the like. Note that application of the electro optical device according to the aspects of the invention is not limited to display an image. For example, in an image forming device (printer) by which a latent image is formed on an image carrier such as a photosensitive drum by emission of light beam, the electro optical device according to the aspects of the invention can be employed also as means for exposing the image carrier (so called exposure head).

BRIEF DESCRIPTION OF THE DRAWINGS

The invention will be described with reference to the accompanying drawings, wherein like numbers reference like elements.

DETAILED DESCRIPTION OF EMBODIMENTS

A: First Embodiment

Figure 1:
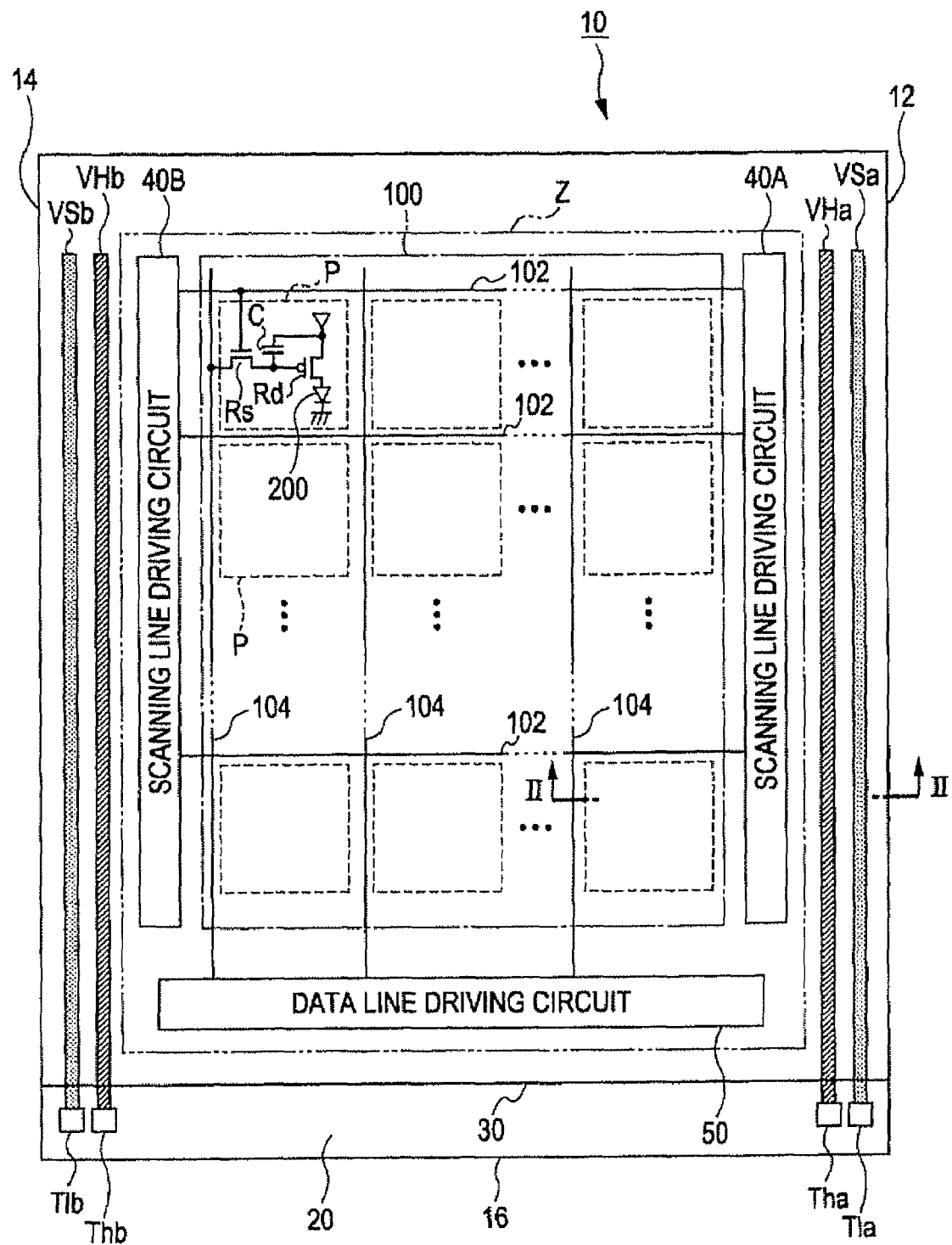
FIG. 1 is a plan view showing an electro optical device according to a first embodiment of the invention.

FIG. 1 is a plan view showing a structure of an electro optical device 10 according to a first embodiment of the invention. The electro optical device 10 is a device that is employed in various electronic apparatuses as means for displaying an image, and is equipped with a first substrate 20 and a second substrate 30 which are bonded to each other in an opposite state. A pixel array unit 100 in which a plurality of pixel circuits P are arranged like a plane, scanning line driving circuits 40A, 40B for driving each pixel circuit P, a data line driving circuit 50, a high potential side potential supply line VHa and a low potential side potential supply line VSa for supplying a potential to the scanning line driving circuit 40A, and a high potential side potential supply line VHb and a low potential side potential supply line VSb for supplying a potential to the scanning line driving circuit 40B are disposed on the surface of a part of the first substrate 20 opposing the second substrate 30.

As shown in FIG. 1, m number of scanning lines 102 that extend in an X direction, and n number of data lines 104 that extend in an Y direction perpendicular to the X direction are provided in the pixel array unit 100 (m, n are natural numbers). Each pixel circuit P is disposed on the position corresponding to the crossing point of the scanning line 102 and the data line 104. Accordingly, the pixel circuits P are arranged in a matrix manner of vertical m-rows horizontal n-columns.

The scanning line driving circuits 40A, 40B shown in FIG. 1 are circuits for selecting the plurality of pixel circuits P for every row unit. The scanning line driving circuits 40A and 40B outputs a scanning signal that becomes active in series to the n number of scanning lines 102. As shown in FIG. 1, the scanning line driving circuit 40A is disposed between the array unit 100 and an edge 12 of the first substrate 20. The scanning line driving circuit 40B is disposed between the pixel array unit 100 and an edge 14 of the first substrate 20.

The data line driving circuit 50 outputs a data signal for specifying a gradation of each of the n number of pixel circuits P corresponding to one row of the scanning line 102 selected by the scanning line driving circuits 40A, 40B to each data line 104. As shown in FIG. 1, the data line driving circuit 50 is disposed between the pixel array unit 100 and an edge 16 of the first substrate 20.

The high potential side potential supply line VHa and the low potential side potential supply line VSa extend along the edge 12 of the first substrate 20. To be more specific, as shown in FIG. 1, the high potential side potential supply line VHa extends along the edge 12 from a high potential side power terminal Tha provided on the surface of the first substrate 20 in the area between the scanning line driving circuit 40A and the edge 12 of the first substrate 20. Further, as shown in FIG. 1, the low potential side potential supply line VSa extends along the edge 12 from a low potential side power terminal Tla provided on the surface of the first substrate 20 in the area between the high potential side potential supply line VSa and the edge 12.

Similarly, the high potential side potential supply line VHb and the low potential side potential supply line VSb extend along the edge 14 of the first substrate 20. To be more specific, as shown in FIG. 1, the high potential side potential supply line VHb extends along the edge 14 from a high potential side power terminal Thb provided on the surface of the first substrate 20 in the area between the scanning line driving circuit 40B and the edge 14 of the first substrate 20. Further, as shown in FIG. 1, the low potential side potential supply line VSb extends along the edge 14 from a low potential side power terminal Tlb provided on the surface of the first substrate 20 in the area between the high potential side potential supply line VSb and the edge 14.

As shown in FIG. 1, each pixel circuit P is equipped with a driving transistor Rd, a transistor Rs, a capacitive element C, and an OLED element 200. An emitting material is sandwiched between a positive pole and a negative pole to constitute the OLED element 200. The OLED element 200 is disposed between a power wire and a ground wire. The driving transistor Rd of a P channel type is disposed between the power wire and the OLED element 200. The source of the driving transistor Rd is connected to the power wire and the drain of the driving transistor Rd is connected to the positive pole of the OLED element 200. The capacitive element C is provided between the gate and source of the driving transistor Rd. Further, the gate of the driving transistor Rd is connected to the source of the transistor Rs of an N channel type. The gate of the transistor Rs is connected to the scanning line 102 and the drain thereof is connected to the data line 104. When a scanning signal supplied via the scanning line 102 is shifted to an active level, the transistor Rs is turned on. Then, the data signal is loaded into the pixel circuit P. A driving current flowing to the OLED element 200 is determined by the voltage between the gate and the source of the driving transistor Rd.

Figure 2:
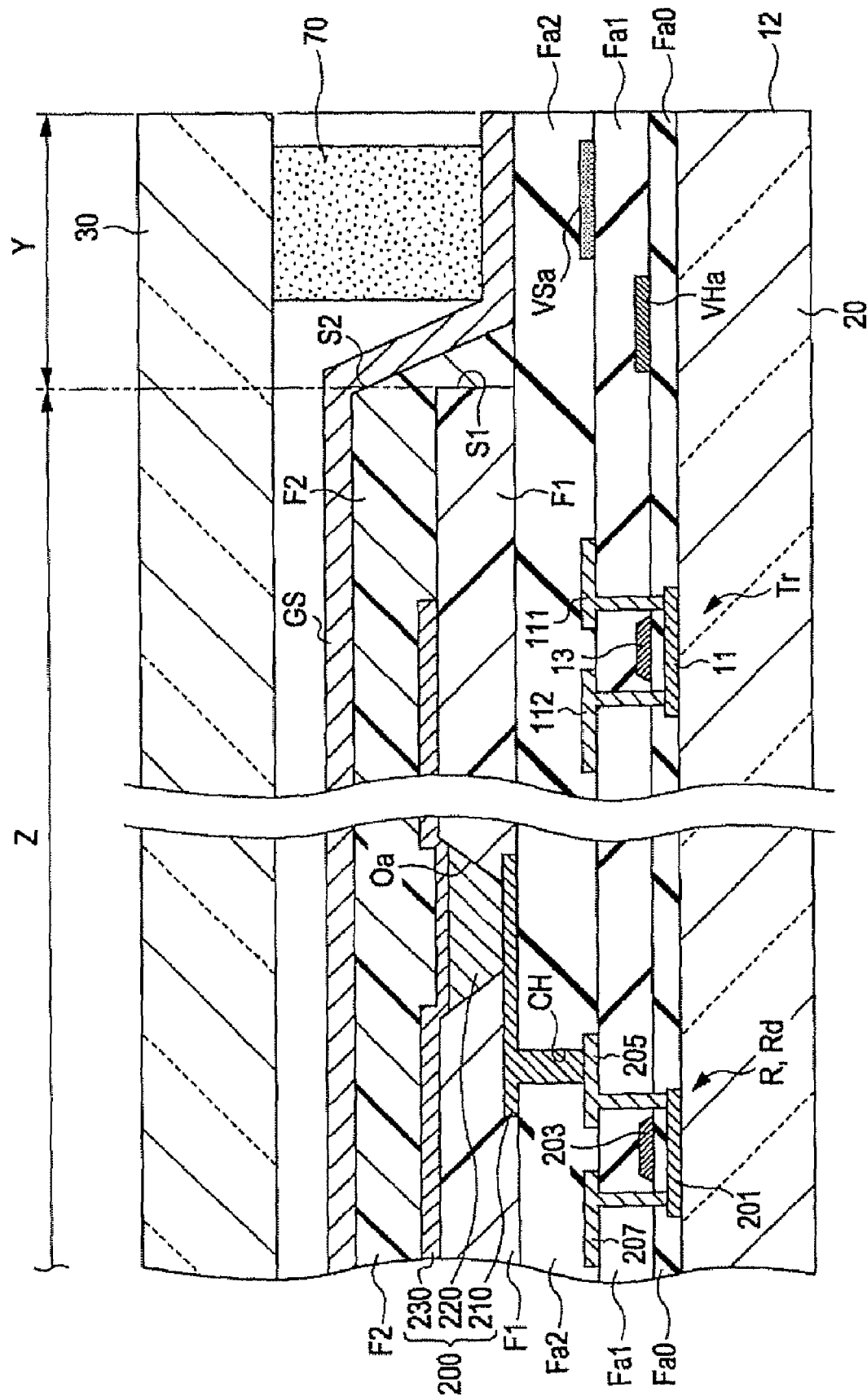
FIG. 2 is a cross sectional view showing the electro optical device according to the embodiment.

FIG. 2 is a cross sectional view taken along the line II-II of FIG. 1. As shown in FIG. 2, a plurality of transistors Tr constituting the scanning line driving circuit 40A (only one transistor Tr is shown in FIG. 2), the high potential side potential supply line VHa and the low potential side potential supply line VSa, and the plurality of transistors R constituting each pixel circuit P (only one driving transistor Rd is shown in FIG. 2) are formed on the surface of the first substrate 20. The structures of the scanning line driving circuit 40B, the high potential side potential supply line VHb, and the low potential side potential supply line VSb are the same as the structures of the scanning line driving circuit 40A, the high potential side potential supply line VHa, and the low potential side potential supply line VSa. Accordingly, the descriptions will be omitted.

The transistor Tr is a thin film transistor including a semiconductor layer 11 formed by a semiconductor material on a surface of the first substrate 20 and a gate electrode opposing the semiconductor layer 11 (channel area) so as to sandwich a gate insulating layer Fa0 covering the semiconductor layer 11. The semiconductor layer 11 is a film body of polysilicon formed, for example, by subjecting an amorphous silicon to a laser annealing treatment. The gate electrode 13 is covered with a first insulating layer Fa1. A drain electrode 111 and a source electrode 112 of the transistor Tr are formed on the surface of the first insulating layer Fa1 with a metal having a low resistance such as aluminum, and are conductively connected with the semiconductor layer 11 (drain area and source area) via contact holes. The drain electrode 111 and the source electrode 112 are covered with a second insulating layer Fa2. The first insulating layer Fa1 and the second insulating layer Fa2 are film bodies formed by an insulating material such as $SiO_2$, SiN, or the like.

As shown in FIG. 2, the high potential side potential supply line VHa is formed on the surface of the gate insulating film Fa0. The gate electrode 13 of the transistor Tr and the high potential side potential supply line VHa are collectively formed by the same processing by a patterning of a conducting film (for example, aluminum thin film) that is continuously formed over the whole area of the gate insulating film Fa0. The case that a plurality of elements are formed by the same process by selective elimination of the common film body (it does not matter whether a single layer or multi layers) as the relation between the gate electrode 13 and the high potential side potential supply line VHa will be hereinafter simply referred to as "formed by the same layer". Materials of each element formed by the same layer are absolutely the same. Accordingly, the thicknesses of each of the films are approximately coincident with each other. According to the structure in which a plurality of elements are formed by the same layer, there is an advantage in that manufacturing process is simplified and manufacturing cost can be reduced as compared with the structure in which elements are formed by separate film bodies.

As shown in FIG. 2, the low potential side potential supply line VSa is formed by the same layer as the drain electrode 111 and the source electrode 112 on the surface of the first insulating layer Fa1.

The transistor R is a thin film transistor having the material and the laminated structure similar to those of the transistor Tr. As shown in FIG. 2, the transistor R includes a semiconductor layer 201 formed on the surface of the first substrate 20, and a gate electrode 203 opposing the semiconductor layer 201 to sandwich the gate insulating film Fa0. A drain electrode 205 and a source electrode 207 of the transistor R are formed on the surface of the first insulating film Fa1 covering the gate electrode 203, and are conductively connected to the semiconductor layer 201 (source area and drain area) via contact holes.

As shown in FIG. 2, pixel electrodes 210 are formed on the surface of the second insulating film Fa2. The pixel electrodes 210 are formed separately for every plurality of OLED elements 200. The pixel electrode is an electrode that functions as a positive pole of the OLED element 200, and is formed by an optical transparency conductive material such as ITO (Indium Tin Oxide), IZO (Indium Zinc Oxide), or the like. As shown in FIG. 2, the pixel electrode 210 is electrically connected to the drain electrode 205 of the driving transistor Rd via a contact hole CH that passes through the second insulating layer Fa2.

As shown in FIG. 2, a first planarizing layer F1 is formed on the surface of the second insulating layer Fa2 with various insulating materials such as an organic material such as acrylic, an inorganic material such as $SiO_2$, SiN, or the like. In FIG. 1, an area Z in which the first planarizing layer F1 is provided is shown by a two-dot chain line. As shown in FIG. 1, each pixel circuit P on the first substrate 20 and the driving circuits (scanning line driving circuits 40A, 40B, the data line driving circuit 50, and the like) used for driving each pixel circuit P are covered with the first planarizing layer F1.

As shown in FIG. 2, an opening part Oa is formed at a portion of the first planarizing layer F1 which overlaps with the pixel electrode 210 of each pixel circuit P. An emission layer 220 of the OLED element 200 is formed in a space inside each pixel circuit P whose bottom surface is the pixel electrode 210. That is, the pixel electrode 210 of each pixel circuit P is separated by the first planarizing layer F1. An ink jet method (liquid drop ejecting method) for, for example, ejecting a liquid drop of an emitting material from a nozzle to adhere the liquid drop on the surface of the pixel electrode 210 is preferably used for forming the emission layer 220. Note that various function layers (hole injection layer, hole transport layer, electron injection layer, electron transport layer, hole block layer, electron block layer, and the like) may be laminated on the emission layer 220 in order to facilitate or streamline emission with the emission layer 220.

The first planarizing layer F1 functions as an element for separating the area where a liquid drop of an emitting material reaches for every OLED element 200 when forming the emission layer 220. Further, as shown in FIG. 2, the plurality of transistors Tr constituting the scanning line driving circuit 40A are covered with the first planarizing layer F1. Herewith, a step that appears on the surface of the second insulating layer Fa2 due to the transistor Tr is reduced (planarized).

The counter electrode 230 shown in FIG. 2 is an electrode that functions as a negative pole of the OLED element 200. The counter electrode 230 is disposed at the side opposite to the first substrate 20 when viewed from the pixel electrode 210, and the emission layer 220 is interposed between the counter electrode 230 and the pixel electrode 210. The counter electrode 230 is continuously formed over the OLED elements 200 of the plurality of pixel circuits P. As a material for the counter electrode 230, various light reflecting conductive materials such as a metal such as aluminum, silver, or the like, an alloy whose main component is the metal, or the like are employed. In the embodiment, the light emitted from the emission layer 220 to the pixel electrode 210 side and the light emitted from the emission layer 220 to the side opposite to the pixel electrode 210 and reflected by the counter electrode 230 to travel toward the pixel electrode 210 are passed through the pixel electrode 210 and the first substrate 20 to be emitted outside (bottom emission).

As shown in FIG. 2, a second planarizing layer F2 for planarizing the area in which the first planarizing layer F1 and the second electrode 230 are provided is formed on the surface of the first planarizing layer F1 and the counter electrode 230. As shown in FIG. 2, the second planarizing layer F2 also covers a side surface S1 of the planarizing layer F1. The second planarizing layer F2 is constituted by, for example, epoxy oligomer, acrylic oligomer, or the like obtained by diluting a polymer material (for example, organic resin material) having lipophilic property such as epoxy resin, acrylate resin, or the like with a lipophilic organic solvent such as toluene, xylene, cyclohexane, or the like to adjust to have a prescribed viscosity.

A gas barrier layer GS is formed on the surface of the second planarizing layer F2. The gas barrier GS prevents moisture and gas to intrude inside the second planarizing layer F2. Herewith, deterioration or the like of the counter electrode 230 and the emission layer 220 can be restrained. In the embodiment, the gas barrier layer GS covers a side surface S2 of the second planarizing layer F2, and the gas barrier layer GS extends to the edge 12 of the first substrate 20. The gas barrier layer GS is constituted by an inorganic compound. For example, the gas barrier layer GS may be constituted with a silicon compound such as silicon nitride, silicon oxide, or the like formed by a high density plasma processing method, or may be constituted with alumina, tantalum oxide, titanium oxide, or another ceramic.

Herein, as shown in FIG. 2, the inclination angle of the side surface S2 of the second planarizing layer F2 with respect to the first substrate 20 is smaller than the inclination angle of the side surface S1 of the first planarizing layer F1 with respect to the first substrate 20. Accordingly, according to the structure of the embodiment, occurrence of cracking or peeling of the gas barrier layer GS can be restrained as compared with the structure in which the gas barrier layer GS is directly provided on the surface of the first planarizing layer F1.

As shown in FIG. 2, a seal material 70 is provided outside the area in which the second planarizing layer F2 is provided (edge 12 side of the first substrate 20). Then, as shown in FIG. 2, the first substrate 20 and the second substrate 30 are bonded via the seal material 70 so as to oppose to each other. The seal material 70 is an adhesive agent for bonding the first substrate 20 and the second substrate 30.

Figure 3:
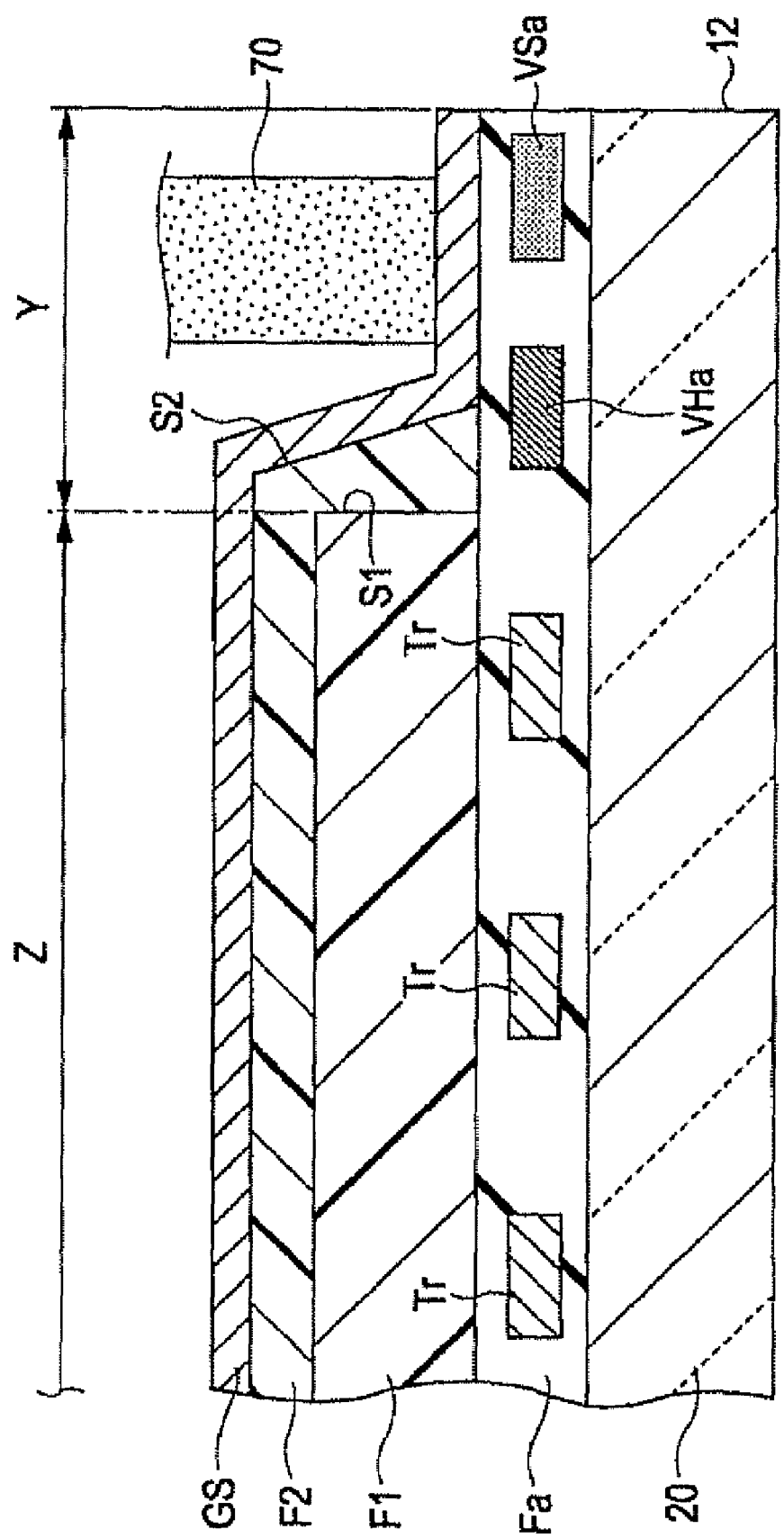
FIG. 3 is a diagram schematically showing the cross sectional view of FIG. 2.

FIG. 3 is a diagram simply showing the cross sectional diagram of FIG. 2. In FIG. 3, the plurality of transistors R constituting each pixel circuit P and the second substrate 30 are omitted for convenience of explanation. As shown in FIG. 3, the high potential side potential supply line VHa and the low potential side potential supply line VSa are disposed in an area Y outside an area Z in which the first planarizing layer F1 is provided on the first substrate 20. In the area Y, at least a part of the high potential side potential supply line VHa overlaps with the second planarizing layer F2. To be more specific, as shown in FIG. 3, the portion of the second planarizing layer F2 covering the side surface S1 of the first planarizing layer F1 is disposed in the area Y. Then, the portion of the second planarizing layer F2 covering the side surface S1 of the first planarizing layer F1 overlaps with a part of the high potential side potential supply line VHa in the area Y.

Further, in the area Y, at least a part of the low potential side potential supply line VSa overlaps with the seal material 70 provided in the area Y. To be more specific, as shown in FIG. 3, the seal material 70 is provided in an area outside the area in which the second planarizing layer F2 is provided among the area Y (edge 12 side of the first substrate 20). Then, the seal material 70 overlaps with a part of the low potential side potential supply line VSa in the Y area.

Figure 4:
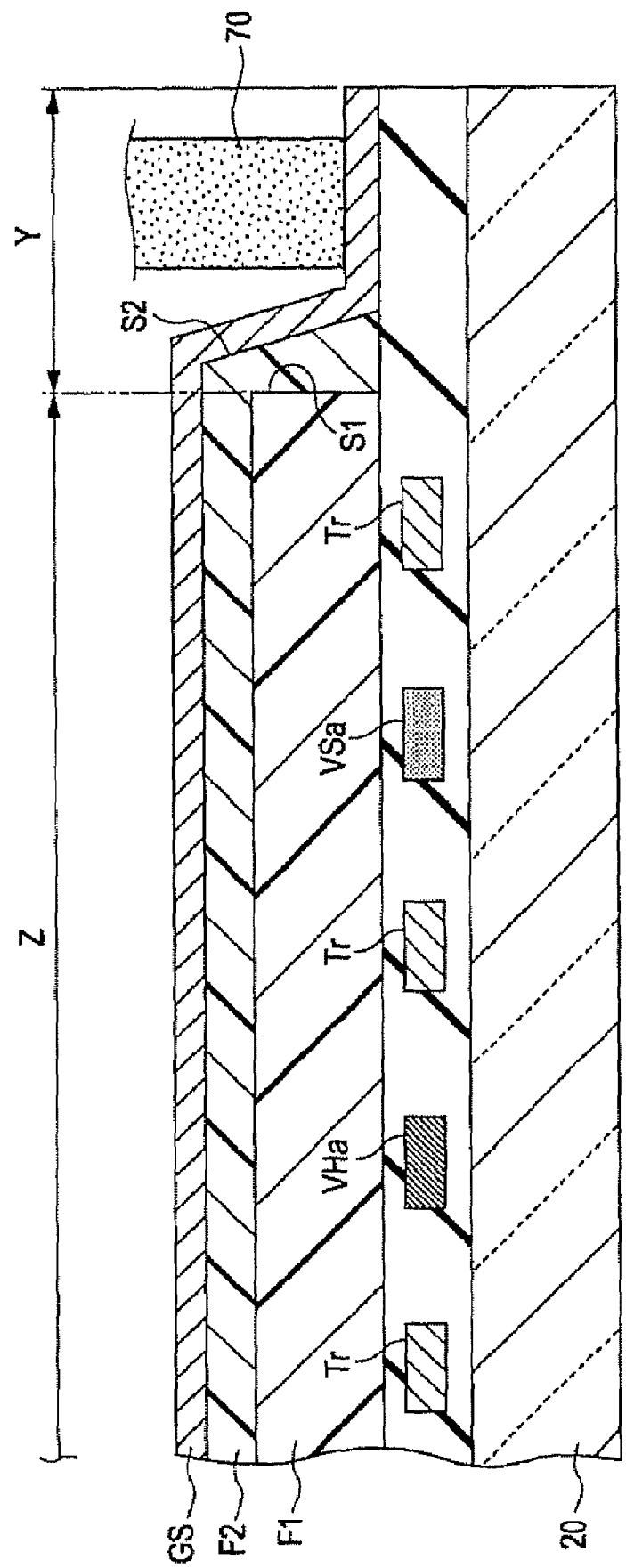
FIG. 4 is a cross sectional view showing an electro optical device according to related art.

FIG. 4 is a cross sectional view showing an aspect (hereinafter, referred to as related art) in which the high potential side potential supply line VHa and the low potential side potential supply line VSa are disposed in the area Z. As shown in FIG. 4, in the related art, the high potential side potential supply line VHa and the low potential side potential supply line VSa are covered with the first planarizing layer F1 with the plurality of transistors Tr constituting the scanning line driving circuit 40A. As shown in FIG. 4, the high potential side potential supply line VHa and the low potential side potential supply line VSa according to the related art do not overlap with the portion of the second planarizing layer F2 covering the side surface S1 of the first planarizing layer F1 or the seal material 70 in the area Y outside the area Z in which the first planarizing layer is provided.

In an embodiment of the invention, the high potential side potential supply line VHa and the low potential side potential supply line VSa are disposed in the area Y outside the area Z in which the first planarizing layer F1 is provided. As shown in FIG. 2, the high potential side potential supply line VHa and the low potential side potential supply line VSa are constituted by a single layer of a metal. Consequently, a step that appears in the area corresponding to the potential supply line is smaller than a step that appears in the area corresponding to the transistor Tr formed by laminating a number of layers among the surface of the insulating layer Fa covering the potential supply lines (high potential side potential supply line VHa, low potential side potential supply line VSa) and the transistor Tr. Accordingly, the gas barrier layer GS can be directly provided in the area corresponding to the potential supply line on the surface of the insulating layer Fa. That is, it is not necessary to cover the high potential side potential supply line VHa and the low potential side potential supply line VSa with the first planarizing layer F1.

Then, as is understood from FIGS. 2, 3 in the Y area, the portion of the second planarizing layer F2 covering the side surface S1 of the first planarizing layer F1 overlaps with a part of the high potential side potential supply line VHa. Accordingly, the area of the first substrate 20 except the pixel array unit 100, that is, the dimensions of the frame portion can be reduced by the overlapped amount as compared with the related art. Further, in the area Y, the seal material 70 overlaps with a part of the low potential side potential supply line VSa, so that the dimensions of the frame portion can be further reduced by the overlapped amount as compared with the related art.

Further, in the embodiment, as shown in FIGS. 2, 3, the inclination angle of the side surface S2 of the second planarizing layer F2 with respect to the first substrate 20 is smaller than the inclination angle of the side surface S1 of the first planarizing layer F1 with respect to the first substrate 20. In this case, the side surface S2 of the second planarizing layer F2 becomes flat as the inclination angle of the side surface S2 of the second planarizing layer F2 becomes smaller than the inclination angle of the side surface S1 of the first planarizing layer F1. Accordingly, occurrence of cracking and peeling of the gas barrier layer GS provided on the surface of the second planarizing layer F2 can be restrained. On the other hand, in the related art, dimensions of the area in which the second planarizing layer F2 is provided become larger, so that it becomes difficult to narrow the frame portion in the structure of the related art. In contrast, in the claimed embodiment, a part of the high potential side potential supply line VHa overlaps with the second planarizing layer F2 in the area Y, so that dimensions of the frame portion can be reduced as compared with the related art. That is, according to the structure of the embodiment, the frame portion can be narrowed while restraining occurrence of cracking and peeling of the gas barrier layer GS.

B: Second Embodiment

Figure 5:
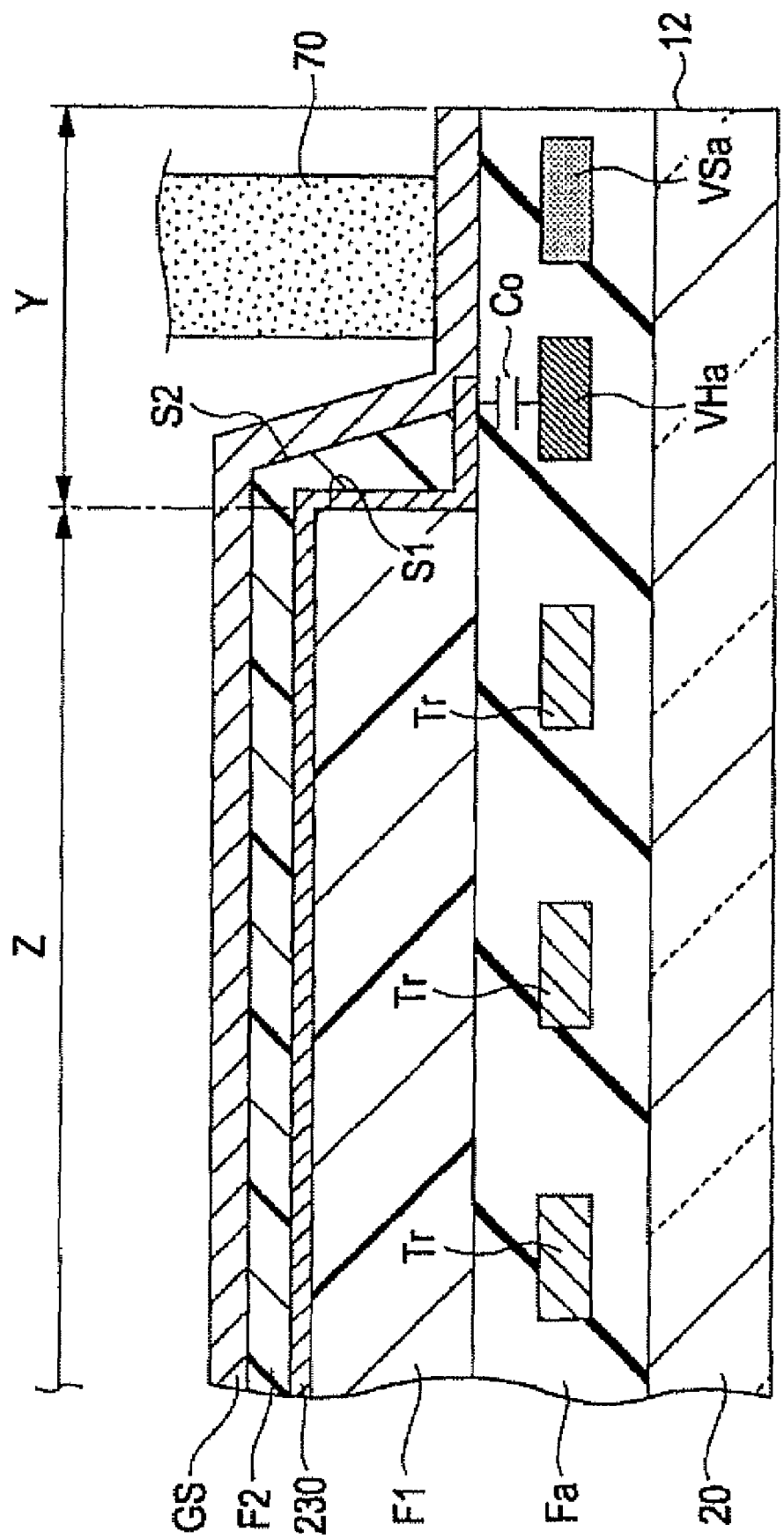
FIG. 5 is a cross sectional view showing an electro optical device according to a second embodiment.

FIG. 5 is a cross sectional view showing the electro optical device 10 according to a second embodiment of the invention (corresponding to FIG. 3). As shown in FIG. 5, in the embodiment, the counter electrode 230 continues over the plurality of the electro optical elements 200 of the pixel circuits P and extends in the Y direction, and overlaps with at least a part of the potential supply lines via the insulating layer Fa (first insulating layer Fa1 and second insulating layer Fa2 shown in FIG. 2) covering the potential supply lines. This point is different from the structure of the first embodiment. Other structure is the same as the structure of the first embodiment, so that the description of the same structure will be omitted.

As shown in FIG. 5, the counter electrode 230 extends from the surface of the first planarizing layer F1 to the surface of the insulating layer Fa through the side surface S1. The portion of the counter electrode 230 extending in the area Y overlaps with a part of the high potential side potential supply line VHa via the insulating layer Fa. Herewith, as shown in FIG. 5, a capacitor Co is formed between the counter electrode 230 and the high potential side potential supply line VHa. Voltage fluctuation of the counter electrode 230 and the high potential side potential supply line VHa is restrained (planarized) by the capacitor Co.

C: Third Embodiment

Figure 6:
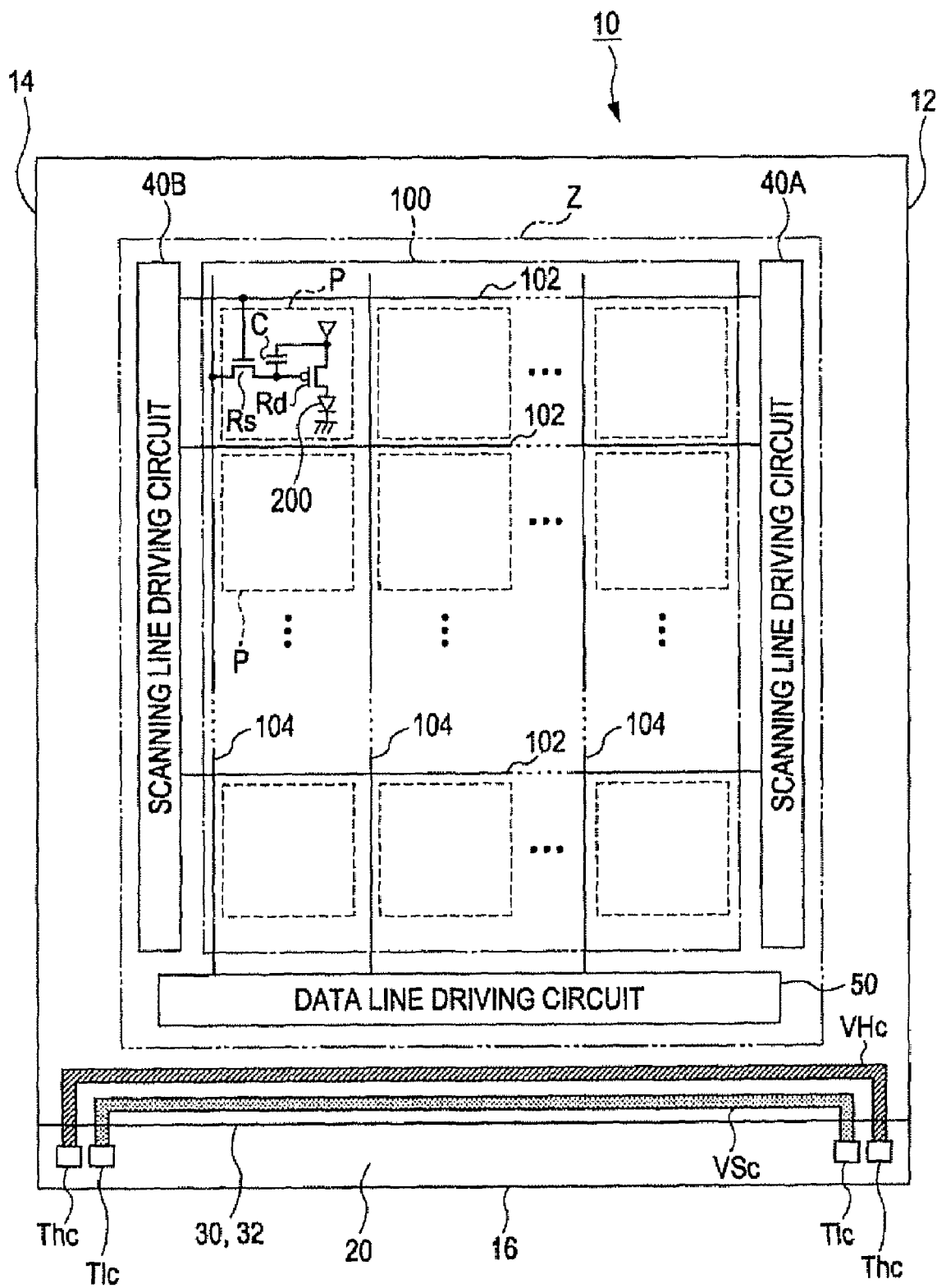
FIG. 6 is a plan view showing an electro optical device according to a third embodiment.

FIG. 6 is a plan view showing the electro optical device 10 according to a third embodiment of the invention. In the embodiment, a high potential side potential supply line VHc and a low potential side potential supply line VSc for supplying a potential to the data line driving circuit 50 are disposed on the surface of a part of the first substrate 20 opposing the second substrate 30.

The high potential side potential supply line VHc and the low potential side potential supply line VSc extend along an edge 16 of the first substrate 20 in the area outside the area Z in which the first planarizing layer F1 is provided. To be more specific, as shown in FIG. 6, the high potential side supply line VHc extends from high potential side power terminals Thc provided on the surface of the first substrate 20 along the edge 16 in the area between the data line driving circuit 50 and the edge 16 of the first substrate 20. Further as shown in FIG. 6, the low potential side potential supply line VSc extends from low potential side power terminals Tlc provided on the surface of the first substrate 20 along the edge 16 in the area between the high potential side potential supply line VSc and the edge 16. Further, as shown in FIG. 6, the high potential side potential supply line VHc and the low potential side potential supply line VSc are disposed between the data line driving circuit 50 and an edge 32 of the second substrate 30.

As is omitted in the drawing, also in the embodiment, similarly to the aforementioned each embodiment, a part of the second planarizing layer F2 covering the first planarizing layer F1 that covers the side surface S1 of the first planarizing layer F1 overlaps with a part of the high potential side potential supply line VHc in the area Y outside the area Z covered with the first planarizing layer F1. Further in the area Y, the seal material 70 overlaps with a part of the low potential side potential supply line VSc. Herewith, the frame part of the electro optical device 10 can be narrowed.

D: Modifications

The invention is not limited to the aforementioned each embodiment, and for example, modifications to be described below can be applied to the embodiment. Further, not less than two modifications among the modifications to be described below may be combined.

(1) Modification 1

In the aforementioned each embodiment, the second planarizing layer F2 overlaps with a part of the high potential side potential supply line VHa in the are Y outside the area Z in which the first planarizing layer F1 is provided. Alternatively, for example, the second planarizing layer F2 may overlaps with both of the high potential side potential supply line VHa and the low potential side potential supply line VSa, or the second planarizing layer F2 may overlap with only a part of the low potential side potential supply line VSa, in the area Y. In short, what is essential is that the second planarizing layer F2 covers the side surface S1 of the first planarizing layer F1 and overlaps with at least a part of the potential supply lines in the area Y.

(2) Modification 2

In the aforementioned each embodiment, a part of the low potential side potential supply line VSa overlaps with the seal material 70 in the area Y. Alternatively, both of the high potential side potential supply line VHa and the low potential side potential supply line VSa may overlap with the seal material 70, or only a part of the low potential side potential supply line VSa may overlap with the seal material 70. In short, what is essential is that the potential supply lines extend along the edge of the first substrate 20 in the area Y and at least a part thereof overlaps with the seal material 70.

(3) Modification 3

Figure 7:
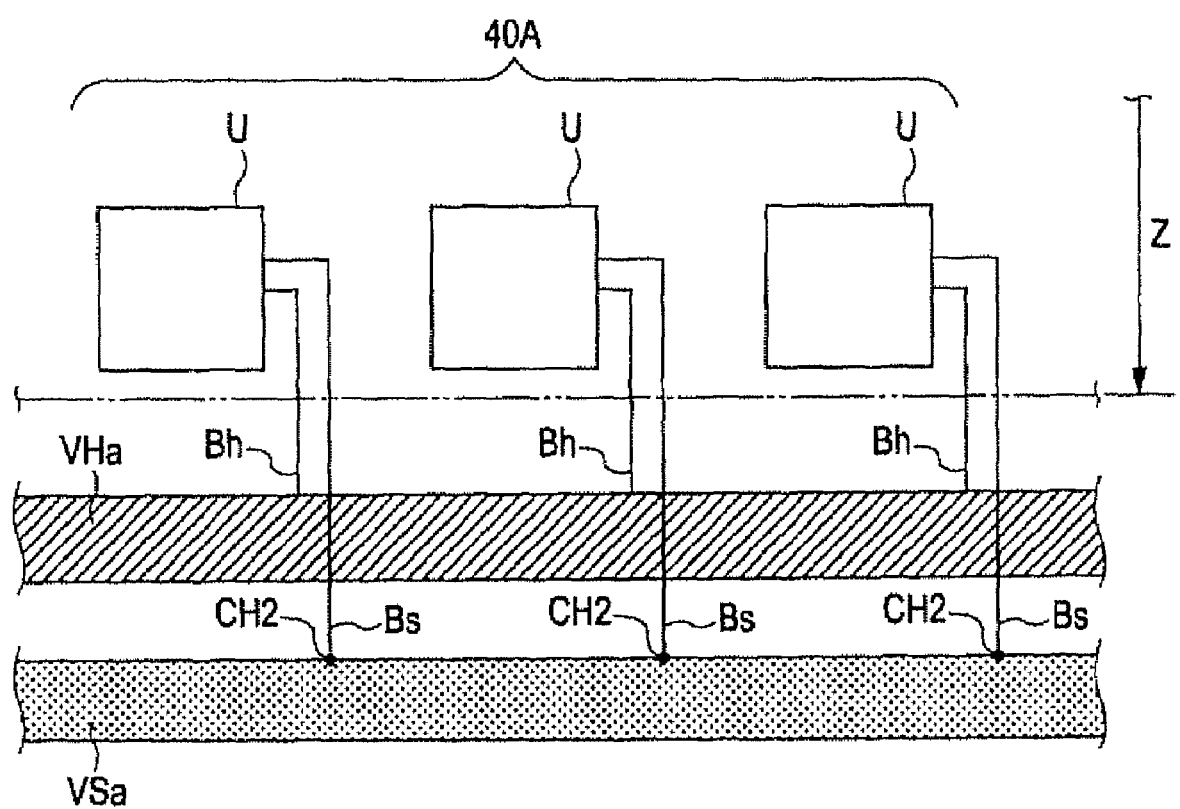
FIG. 7 is a diagram showing a connection aspect between a potential supply line and a driving circuit according to a modification.

In the aforementioned each embodiment, as shown in FIG. 2, the high potential side potential supply line VHa and the low potential side potential supply line VSa are formed by different layers. However, as shown in FIG. 7, for example, the high potential side potential supply line VHa and the low potential side potential supply line VSa may be formed by the same layer. In FIG. 7, the high potential side potential supply line VHa and the low potential side potential supply line VSa are formed by the same layer as the drain electrode 111 and the source electrode 112 of the transistor Tr shown in FIG. 2. Alternatively, the high potential side potential supply lien VHa and the low potential side potential supply line VSa may be formed by the same layer as the gate electrode 13 of the transistor Tr shown in FIG. 2.

As shown in FIG. 7, the scanning line driving circuit 40A is constituted by a plurality of unit circuits U (latch circuit) each of which outputs a scanning signal. One unit circuit U is constituted by a plurality of transistors Tr. As shown in FIG. 7, each of a plurality of branch buses Bh branched from the high potential side potential side supply line VHa (main bus) is connected to corresponding one of the unit circuit U. As shown in FIG. 7, the high potential side potential supply line VHa has an enough thickness as compared with the branch bus Bh. Similarly, each of a plurality of branch buses Bs branched from the low potential side potential supply line VSa (main bus) is connected to corresponding one of the unit circuit U.

In the structure shown in FIG. 7, the plurality of branch buses Bs is formed by a layer different form the high potential side potential supply line VHa and the low potential side potential supply line VSa. As shown in FIG. 7, the branch bus Bs is connected to the low potential side potential supply lines VSa via a contact hole CH2, steps over the high potential side potential supply line VHa, and extends to the unit circuit U.

On the other hand, as in the aforementioned each embodiment, with the structure in which the high potential side potential supply line VHa and the low potential side potential supply line VSa are formed by different layers, it is not necessary to connect the potential supply line and the branch bus B via the contact hole CH2. Accordingly, there is an advantage in that certainty of conduction between the potential supply line and the branch bus B is improved as compared with the structure of FIG. 7.

(4) Modification 4

In the aforementioned each embodiment, the light emitted from the emission layer 220 is passed through the pixel electrode 210 and the first substrate 20 and is output outside. Alternatively, the light emitted from the emission layer 220 may be passed through the counter electrode 230 and the second substrate 30 and emitted outside. In this case, the counter electrode 230 is formed by a light transmissive conductive material, and color filters corresponding to each of the OLED elements 200 and a light shielding layer for shielding a gap between the color filters are formed on the surface of a part among the second substrate 30 opposing the first substrate 20 (top emission).

(5) Modification 5

In the aforementioned each embodiment, in the area Y, the second planarizing layer F2 overlaps with a part of the high potential side potential supply line VHa, and the seal material 70 overlaps with a part of the low potential side potential supply line VSa. Alternatively, only the second planarizing layer F2 may overlap with at least a part of the potential supply lines in the area Y. For example, in the area Y, the second planarizing layer F2 overlaps with a part of the high potential side potential supply line VHa, and the sea material 70 does not overlaps with the low potential side potential supply line VSa. Alternatively, in the area Y, only the seal material 70 may overlap at least a part of the potential supply lines. For example, in the area Y, the second planarizing layer F2 does not overlap with the high potential side potential supply line VHa, and the seal material 70 overlaps with a part of the low potential side potential supply line VSa. In this regard, as in the aforementioned each embodiment, in the aspect in which the second planarizing layer F2 overlaps with a part of the high potential side potential supply line VHa and the seal material 70 overlaps with a part of the low potential side potential supply line VSa, in the area Y, there is an advantage in that the frame portion can be reduced as compared with the aspect in which only the second planarizing layer F2 overlaps with a part of the potential supply line or the aspect in which only the seal material 70 overlaps with a part of the potential supply line, in the area Y.

(6) Modification 6

In the second embodiment, the portion of the counter electrode 230 extending in the area Y overlaps with a part of the high potential side potential supply line VHa via the insulating layer Fa. Alternatively, the portion of the counter electrode 230 extending in the area Y may overlap with a part of the low potential side potential supply line VSa via the insulating layer Fa. In short, what is essential is that one of the electrodes constituting the electro optical element 200 continues over the plurality of electro optical elements 200 of each pixel circuit P and extends to the area Y, and overlaps with at least a part of the potential supply line via the insulting layer Fa.

(7) Modification 7

In the aforementioned each embodiment, the scanning line driving circuits 40 and the data line driving circuit 50 are used as an example of the driving circuit for driving the plurality of electro optical elements 200. Alternately, for example, a static charge protection circuit may be used. In short, what is essential is that the driving circuit is a circuit constituted by a plurality of transistors Tr and used for driving the plurality of electro optical elements.

(8) Modification 8

In the aforementioned each embodiment, as an example of the electro optical element 200, the OLED element is employed. Alternatively, the electro optical element 200 may be an inorganic light emitting diode or an LED (Light Emitting Diode).

(9) Modification 9

Figure 8:
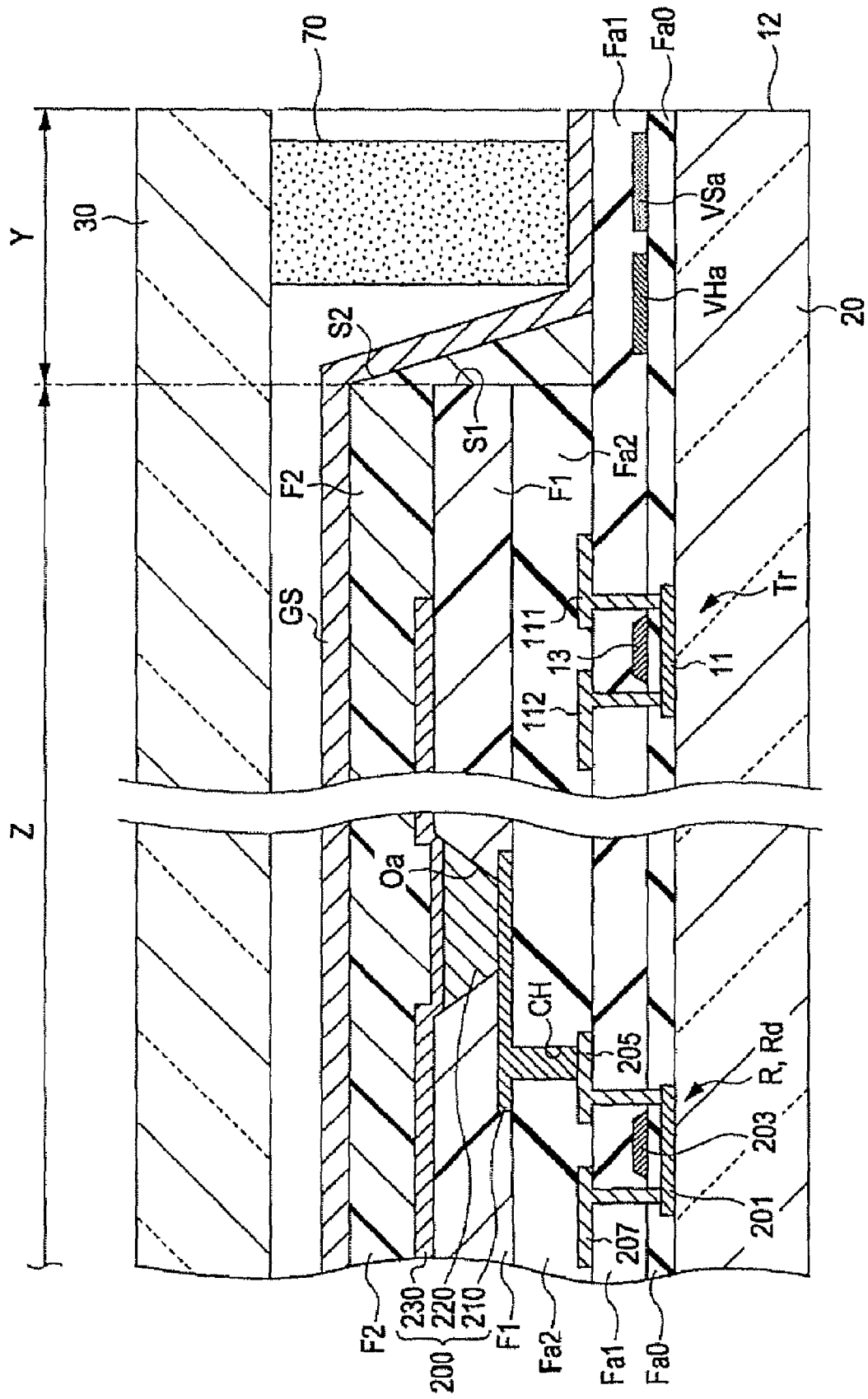
FIG. 8 is a cross sectional view showing an electro optical device according to a modification.

In the aforementioned each embodiment, the second insulating layer Fa2 covering the electrodes of the driving transistor Rd is provided over the area Z and the area Y. However, as shown in FIG. 8, the second insulating layer Fa2 man be provide only in the area Z similarly to the first planarizing layer F1. In the structure, the high potential side potential supply line VHa and the low potential side potential supply line VSa are disposed in the area Y outside the area Z in which the first planarizing layer F1 and the second Insulating layer Fa2 are provided on the first substrate 20, and a part of the high potential side potential supply line VHa overlaps with the second planarizing layer F2. In addition, in FIG. 8, the seal material 70 disposed in the area Y overlaps with a part of the high potential side potential supply line VHa and the low potential side potential supply line VSa.

Alternatively, the structure may be employed in which the second insulating layer Fa2 is provided only in the area Z whereas the first planarizing layer F1 is provided over the area Z and the area Y. In the structure, the high potential side potential supply line VHa and the low potential side potential supply line VSa are disposed in the area Y outside the area Z in which the second insulating layer Fa2 is provided on the first substrate 20, and at least a part thereof overlaps with the second planarizing layer F2. Then similarly to the structure of FIG. 8, the seal material 70 overlaps with at least a part of the high potential side potential supply line VHa and the low potential side potential supply line VSa.

In short, what is essential is that the potential supply line extends along the edge of the first substrate 20 in the area Y outside the area Z in which the insulating layers (first planarizing layer F1, second insulating layer Fa2) provided between the driving transistor Rd and the counter electrode 230 are formed, and at least a part thereof overlaps with the second planarizing layer F2 or the seal material 70.

Further, similarly to the second embodiment, the counter electrode 230 continuing over each pixel circuit P may extend in the area Y and overlap with at least a part of the high potential side potential supply line VHa and the low potential side potential supply line VSa via the first insulating layer Fa1.

E: Applications

Figure 9:
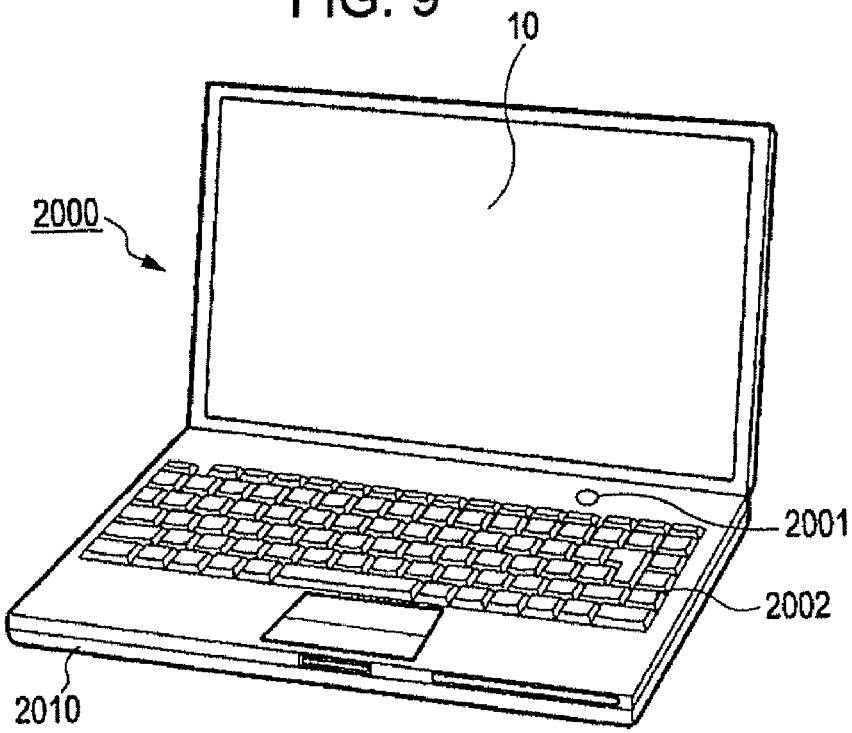
FIG. 9 is a perspective view showing a concrete example of an electronic apparatus according to the invention.

Next, an electronic apparatus using the electro optical device 10 according to the invention will be described. FIG. 9 is a perspective view showing a structure of a mobile type personal computer a in which the electro optical device 10 according to any of the embodiments described above is employed a display device. A personal computer 2000 is equipped with the electro optical device 10 as a display device and a main body unit 2010. A power switch 2001 and a key board 2002 are provided in the main body unit 2010. The electro optical device 10 uses an OLED element for an electro optical element, so that a screen that provides a wide viewing angle and that is easy for a user to see can be displayed.

Figure 10:
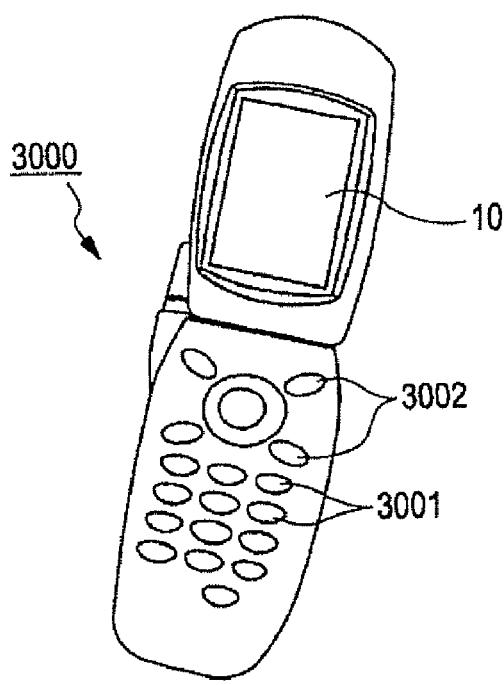
FIG. 10 is a perspective view showing a concrete example of the electronic apparatus according to the invention.

A structure of a mobile phone to which the electro optical device 10 according to the embodiment is applied is shown in FIG. 10. A mobile phone 3000 is equipped with a plurality of operation buttons 3001, scroll buttons 3002, and the electro optical device 10 as a display unit. By operating the scroll buttons 3002, a screen displayed on the electro optical device 10 is scrolled.

Figure 11:
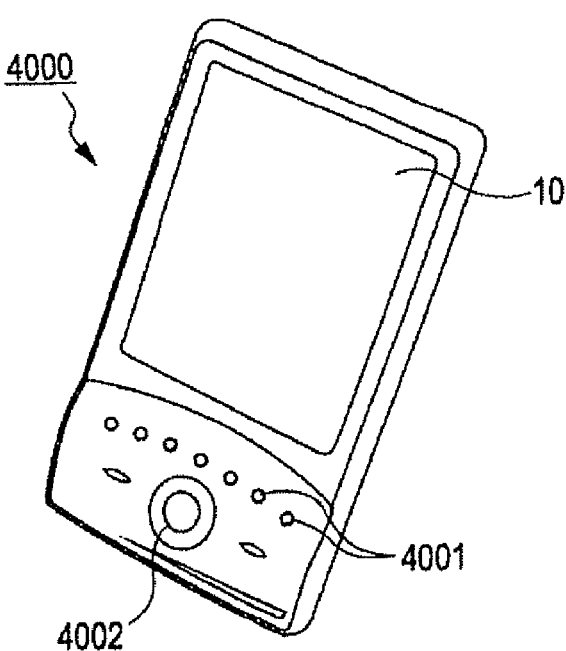
FIG. 11 is a perspective view showing a concrete example of the electronic apparatus according to the invention.

A structure of a PDA (Personal Digital Assistants) to which the electro optical device 10 according to the embodiment is applied is shown in FIG. 11. A PDA 4000 is equipped with a plurality of operation buttons 4001, a power switch 4002, and the electro optical device 10 as a display device. When the power switch 4002 is operated, various information such as an address book, a schedule book, or the like is displayed on the electro optical device 10.

Note that, as for electronic apparatuses to which the electro optical device according to the invention is applied, besides the electronic apparatuses shown in FIGS. 9 to 11, there are included a digital still camera, a television, a video camera, a car navigation device, a pager, an electronic organizer, an electronic paper, an electronic calculator, a word processor, a workstation, a video telephone, a POS terminal, a printer, a scanner, a copier, a video player, an apparatus equipped with a touch panel, and the like. In addition, the application of the electro optical device according to the invention is not limited to display of an image. For example, in an image formation device such as a optical writing type printer or electronic copier, a writing head for exposing a photo conductor in accordance with an image which should be formed on a recording material such as a paper is used, and the electro optical device of the invention is also used as such a type of wiring head. An electronic circuit of the invention is a notion including a circuit that becomes a unit for exposure in the image forming device besides a pixel circuit that constitutes a pixel of the display device as in each embodiment.

What is claimed is:

1. An electro optical device comprising:
a substrate;
a plurality of scanning lines;
a plurality of data lines;
a plurality of pixel electrodes arranged so as to correspond to intersections of the plurality of scanning lines and the plurality of data lines;
a counter electrode disposed opposite the substrate when viewed from a pixel electrode of the plurality of pixel electrodes;
an emission layer disposed between the pixel electrode and the counter electrode;

a driving transistor electrically connected to the pixel electrode;

a driving circuit for supplying a signal to at least one of the plurality of scanning lines and the plurality of data lines;

a potential supply line for supplying a potential to the driving circuit;

an insulating film provided between the driving transistor and the counter electrode, the insulating film being provided in a first area on the substrate; and a planarizing layer covering the counter electrode, wherein the potential supply line extends along an edge of the substrate in a second area outside the first area on the substrate, and the planarizing layer covers the insulating film and overlaps with at least a part of the potential supply line in the second area.

2. The electro optical device of claim 1 further comprising:

a gas barrier layer for covering the planarizing layer, wherein an inclination angle of a side surface of the planarizing layer with respect to the substrate is smaller than an inclination angle of a side surface of the insulating film with respect to the substrate.

3. An electro optical device comprising:

a first substrate;

a plurality of scanning lines;

a plurality of data lines;

a plurality of pixel electrodes arranged so as to correspond to intersections of the plurality of scanning lines and the plurality of data lines;

a counter electrode disposed opposite the substrate when viewed from a pixel electrode of the plurality of pixel electrodes;

an emission layer disposed between the pixel electrode and the counter electrode;

a driving transistor electrically connected to the pixel electrode;

a driving circuit for supplying a signal to at least one of the plurality of scanning lines and the plurality of data lines;

a potential supply line for supplying a potential to the driving circuit;

an insulating film provided between the driving transistor and the counter electrode, the insulating film being provided in a first area on the first substrate;

a seal material disposed in a second area outside the first area on the first substrate; and a second substrate bonded to the first substrate via the seal material, wherein the potential supply line extends along an edge of the first substrate in the second area, and at least a part of the potential supply line overlaps with the seal material.

4. The electro optical device of claim 1 further comprising an insulating layer covering the potential supply line, wherein the counter electrode continues over the pixel electrode and extends into the second area, and overlaps with at least a part of the potential supply line via the insulating layer.

5. The electro optical device of claim 3 further comprising an insulating layer covering the potential supply line, wherein the counter electrode continues over the pixel electrode and extends into the second area, and overlaps with at least a part of the potential supply line via the insulating layer.

6. The electro optical device of claim 1, wherein the pixel electrode is disposed opposite the substrate when viewed from the driving transistor, and the insulating film is provided between the pixel electrode and the counter electrode, and separates each of the plurality of pixel electrodes.

7. The electro optical device of claim 3, wherein.

the pixel electrode is disposed opposite the substrate when viewed from the driving transistor, and the insulating film is provided between the pixel electrode and the counter electrode, and separates each of the plurality of pixel electrodes.

8. The electro optical device of claim 1, wherein the pixel electrode is disposed opposite the substrate when viewed from the driving transistor, and the insulating film is provided between the driving transistor and the pixel electrode.

9. The electro optical device of claim 3, wherein the pixel electrode is disposed opposite the substrate when viewed from the driving transistor, and the insulating film is provided between the driving transistor and the pixel electrode.

10. The electro optical device of claim 1, the insulating film comprising a first planarizing layer.

11. The electro optical device of claim 3, the insulating film comprising a first planarizing layer.

12. The electro optical device of claim 1, the insulating film comprising an insulating layer and a first planarizing layer, the insulating layer covering the potential supply line.

13. The electro optical device of claim 3, the insulating film comprising an insulating layer and a first planarizing layer, the insulating layer covering the potential supply line.

14. The electro optical device of claim 4, the insulating film comprising the insulating layer and a first planarizing layer, the insulating layer covering the potential supply line.

15. The electro optical device of claim 4, further comprising a capacitor disposed between the counter electrode and the potential supply line.

16. An electro optical device comprising:

a substrate;

a plurality of scanning lines;

a plurality of data lines;

a plurality of pixel electrodes arranged so as to correspond to intersections of the plurality of scanning lines and the plurality of data lines;

a counter electrode disposed opposite the substrate when viewed from a pixel electrode of the plurality of pixel electrodes;

an emission layer disposed between the pixel electrode and the counter electrode;

a driving transistor electrically connected to the pixel electrode;

a driving circuit for supplying a signal to at least one of the plurality of scanning lines and the plurality of data lines;

a potential supply line for supplying a potential to the driving circuit;

a first area on the substrate;

a second area on the substrate; and a planarizing layer extending from the first area into at least part of the second area such that the planarizing layer overlaps with at least a part of the potential supply line, the potential supply line extending along an edge of the substrate in the second area in a direction transverse to the plurality of scanning lines.

17. An electronic apparatus comprising the electro optical device of claim 1.

* * * * *